(12) United States Patent
Duemler et al.

(10) Patent No.: US 10,972,058 B2
(45) Date of Patent: Apr. 6, 2021

(54) PHOTODETECTOR CIRCUIT

(71) Applicant: Integrated Device Technology, Inc., San Jose, CA (US)

(72) Inventors: Ulrich Duemler, Zurich (CH); Bortecene Terlemez, Zurich (CH)

(73) Assignee: Integrated Device Technology, Inc., San Jose, CA (US)

(*) Notice: Subject to any disclaimer, the term of this patent is extended or adjusted under 35 U.S.C. 154(b) by 0 days.

(21) Appl. No.: 16/395,781

(22) Filed: Apr. 26, 2019

(65) Prior Publication Data
US 2019/0334485 A1 Oct. 31, 2019

Related U.S. Application Data

(60) Provisional application No. 62/663,240, filed on Apr. 26, 2018.

(51) Int. Cl.
*H03F 3/08* (2006.01)
*H03F 3/45* (2006.01)

(52) U.S. Cl.
CPC ......... *H03F 3/082* (2013.01); *H03F 3/45941* (2013.01); *H03F 3/45973* (2013.01)

(58) Field of Classification Search
CPC ... H04W 48/16; H04W 72/046; H04W 36/30; H04W 24/10; H04W 56/001; H04W 24/08; H04W 48/12; H04W 36/06; H04W 16/28; H04B 7/088
USPC ........................... 330/293, 75, 129, 254, 308
See application file for complete search history.

(56) References Cited

U.S. PATENT DOCUMENTS 9,780,737 B1 * 10/2017 Asmanis ................... H03F 3/08

* cited by examiner

*Primary Examiner* — Hieu P Nguyen
(74) *Attorney, Agent, or Firm* — Haynes and Boone, LLP

(57) ABSTRACT

In accordance with aspects of the present invention, embodiments of a photodiode circuit. A photodiode circuit according to some embodiments includes a transimpedance amplifier; a resistor coupled across the transimpedance amplifier; and an amplifier stage coupled to receive an output from the transimpedance amplifier, wherein the photodiode circuit provides dynamic range across a current range of the photodiode circuit. In some embodiments, the transimpedance amplifier includes a receive signal strength indicator that provides a DC current signal to a tail of a first amplifier stage, the tail providing a current that is adaptively related to the DC current. In some embodiments, the resistor is a shielded resistor. In some embodiments, the adaptive current sink includes a plurality of switchable parallel current sinks.

7 Claims, 3 Drawing Sheets

PHOTODETECTOR CIRCUIT

RELATED APPLICATIONS

The present application claims priority to U.S. Provisional Patent Application Ser. No. 62/663,240 filed Apr. 26, 2018 and entitled "Photodetector Circuit", which is incorporated by reference in its entirety.

TECHNICAL FIELD

Embodiments of the present invention are related photodiode circuits.

DISCUSSION OF RELATED ART

Photodetectors have multiple uses. Essentially, any application that benefits from detection of electromagnetic radiation (photons) can use a photodetector to detect that radiation. Such applications can include, for example, smoke detectors, light level meters, medical devices, remote controls, spectroscopic detectors, and other applications. However, power consumption, especially in remote or other such applications, becomes a factor such that efficiency and power usage can become important.

In conventional applications, a current signal from a photodetector can be input to a transimpedance amplifier (TIA) followed by further amplifier stages. One of the biggest challenges in the linear TIA design, other than the power consumption, is providing for linear operation over the large dynamic range of the input current from the photodetector. Typically, the linear input range of some specific amplifier is adjusted to a high value to care for the usage with a high input amplitude. That means the post amplifiers need to be linear for a wide range of input swing, which also uses a lot of power. Consequently, battery powered applications can be greatly negatively impacted by operation of the photodetector.

Therefore, there is a need to develop better, more efficient, photodetector technologies.

SUMMARY

In accordance with aspects of the present invention, embodiments of a photodiode circuit. A photodiode circuit according to some embodiments includes a transimpedance amplifier; a resistor coupled across the transimpedance amplifier; and an amplifier stage coupled to receive an output from the transimpedance amplifier, wherein the photodiode circuit provides dynamic range across a current range of the photodiode circuit. In some embodiments, the transimpedance amplifier includes a receive signal strength indicator that provides a DC current signal to a tail of a first amplifier stage, the tail providing a current that is adaptively related to the DC current. In some embodiments, the resistor is a shielded resistor. In some embodiments, the adaptive current sink includes a plurality of switchable parallel current sinks.

These and other embodiments are further discussed below with respect to the following figures.

DETAILED DESCRIPTION

In the following description, specific details are set forth describing some embodiments of the present invention. It will be apparent, however, to one skilled in the art that some embodiments may be practiced without some or all of these specific details. The specific embodiments disclosed herein are meant to be illustrative but not limiting. One skilled in the art may realize other elements that, although not specifically described here, are within the scope and the spirit of this disclosure.

This description and the accompanying drawings that illustrate inventive aspects and embodiments should not be taken as limiting—the claims define the protected invention. Various changes may be made without departing from the spirit and scope of this description and the claims. In some instances, well-known structures and techniques have not been shown or described in detail in order not to obscure the invention.

Elements and their associated aspects that are described in detail with reference to one embodiment may, whenever practical, be included in other embodiments in which they are not specifically shown or described. For example, if an element is described in detail with reference to one embodiment and is not described with reference to a second embodiment, the element may nevertheless be claimed as included in the second embodiment.

Figure 1:
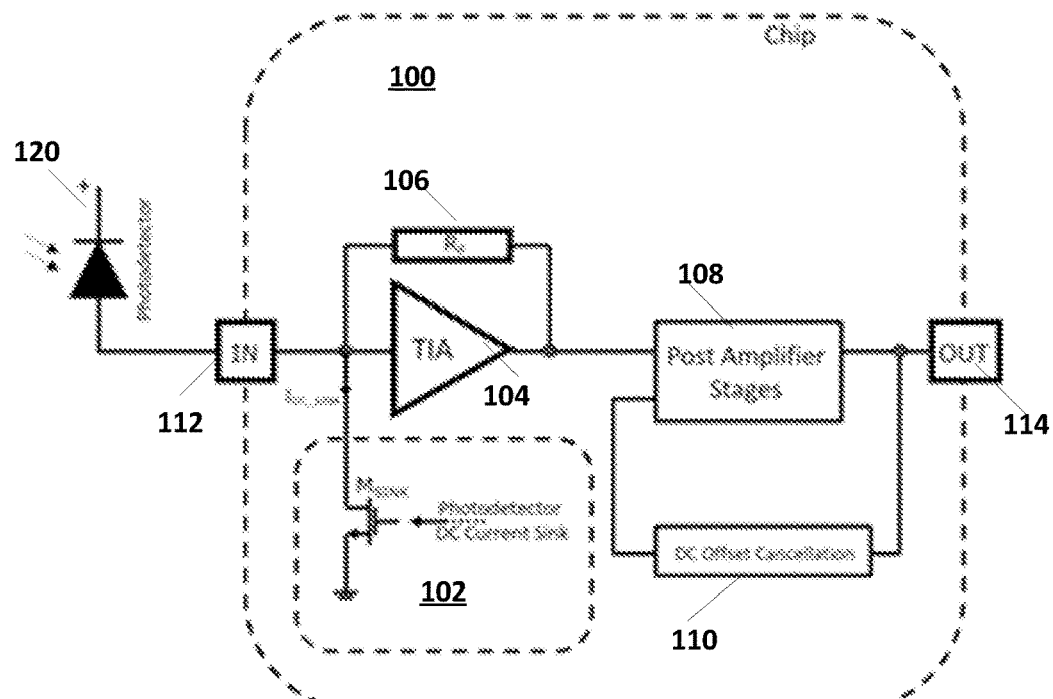
FIG. 1 illustrates a depiction of a conventional transimpedance amplifier in a photodiode circuit.

FIG. 1 illustrates a photodetector circuit 100 that is coupled to receive signals from a photodetector 120. As is illustrated in FIG. 1, the signals from photodetector 120 are received in a transimpedance amplifier (TIA) 104. A feedback resistor 106 is also coupled across TIA 104. Post amplifier stages 108 can be coupled to receive the output signals from TIA 104 and provide an output signal that is related to the optical intensity on photodetector 120. As is further illustrated in FIG. 1, a DC cancellation circuit 110 can be coupled to post amplifier stages 108 to remove any DC offset on the output signal. Additionally, a current sink 102 can be coupled to the output signal from photodetector 120 to remove the DC current.

Photodetector (PD) 120 provides a current signal in response to incident light. As illustrated in FIG. 1, in some examples, a DC component of the current signal, $I_{DC\_Sink}$, is sinked through a sink transistor in current sink 102 and the AC component of the current signal from photodetector 120 can be coupled into the RF chain that includes transimpedance amplifier (TIA) 104 and post amplifiers 108. TIA 104 as well as amplifiers 108 and DC offset cancellation 110 can be formed on a chip with an input pin 112 coupled to receive the current signal from PD 100 and an output pin 114 to provide the processed output signal.

As discussed above, one of the biggest challenges in the linear TIA design is providing for linear operation over the large dynamic range of the input current. Typically, the linear input range of some specific amplifier is adjusted to a high value to care for the usage with a high input amplitude. That means the post amplifiers need to be linear for a wide range of input swing, which may cost power. In according to some embodiments, the input current signal amplitude can be detected, and a specific amplifier's linear input range can be adjusted accordingly.

Embodiments of the present invention provide for better range across a large range of input currents from photodiode 120. In some embodiments, the current through the tail of an amplifier stage is adaptively adjusted according to the DC component of the current from the photodiode 120. In some embodiments, the feedback resistance 106 is replaced with a shielded resistance, which eliminates the need for a feedback capacitance coupled across TIA 104. In some embodiments, sink 102 is replaced with parallel coupled switched transistors that can be disconnected when lower currents from photodiode 120 are received, decreasing the noise levels. Embodiments of the invention can include one or more of these described features, each of which is separately discussed below.

Figure 2:
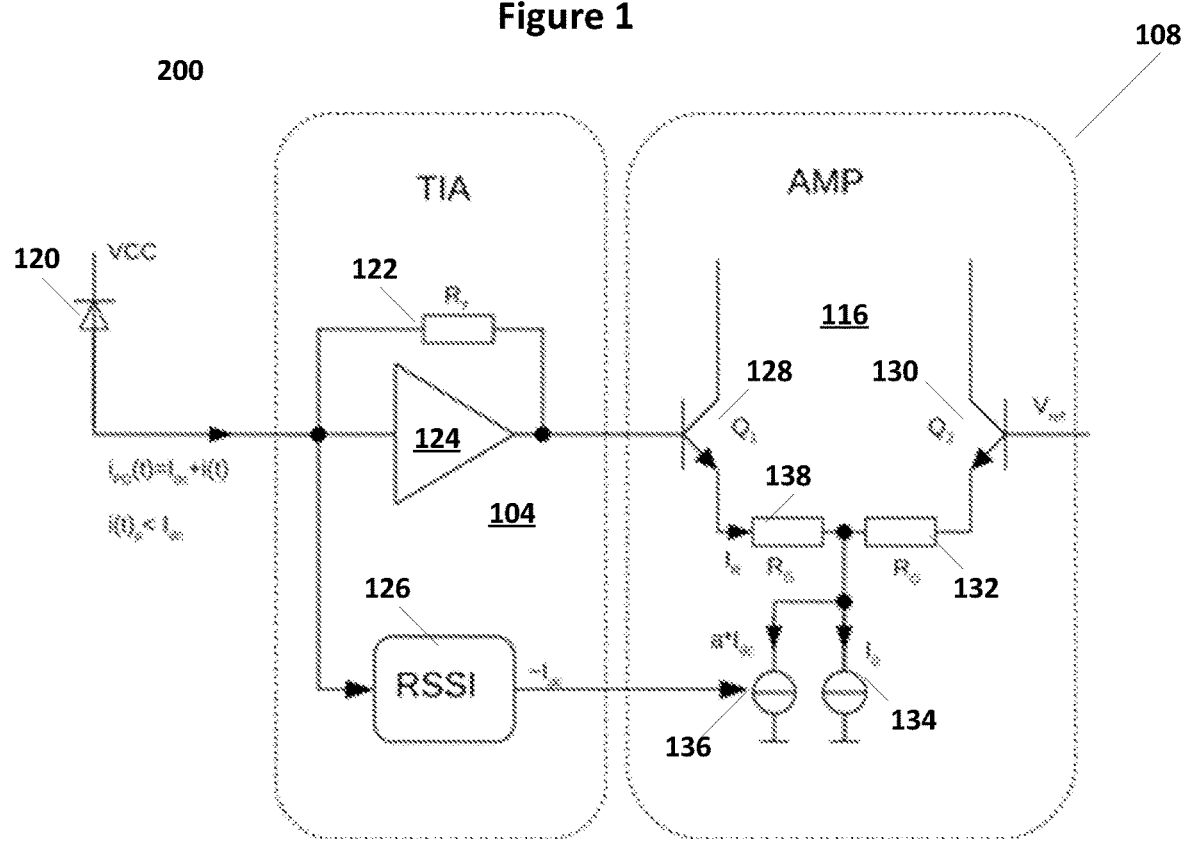
FIG. 2 illustrates a schematic principle of adaptive biasing according to some embodiments.

FIG. 2 illustrates a system 100 that is an embodiment of the present invention. FIG. 2 illustrates a portion of the core of TIA 104 in combination an amplifier stage 116 of post amplifier stages 108 configured according to some embodiments. As illustrated in FIG. 2, TIA 104 converts an input current to a voltage and drives amplifier stage 116. As illustrated in FIG. 2, TIA 104 includes an amplifier 124 with an internal resistance 122 coupled across amplifier 124. In some embodiments, TIA 104 can include a receive signal strength indicator (RSSI) circuit 126. RSSI circuit 126 detects the signal strength of the current received from photodiode 120.

As is further illustrated in FIG. 2, amplifier stage 116 can be a differential amplifier. The output signal from TIA 104 is input to the base of a first transistor 128 (Q1) and a reference voltage is input to the base of a second transistor 130 (Q2). In the embodiment illustrated in FIG. 2, first transistor 128 and second transistor 130 are NPN transistors. The output of amplifier stage 116 is obtained between the collectors of first transistor 128 and second transistor 130. The emitter of first transistor 128 is coupled through a resistance $R_G$ 138 to parallel coupled current sources 134 and 136. The emitter of second transistor 130 is similarly coupled through a resistance $R_G$ 132 to parallel coupled current sources 134 and 136. The current through transistor 128, $I_R$, is dependent on the voltage at the base of transistor 128.

The input linear range of amplifier stage 116 is therefore proportional to the product $I_R*R_G$. For smaller input current levels, a fairly small linear input range is sufficient. For large input current, the linear range of amplifier 116 should be increased to prevent excessive total harmonic distortion (THD). In the conventional design amplifier stages 108 are implemented in a power-hungry fashion to cover the wide dynamic range. Amplifier stage 116 according to the present invention, amplifier stage 116 can cover the dynamic range with much less power usage.

As is illustrated in FIG. 2, the photodiode current that is input to amplifier 124 can be given by $I_{PD}(t)=I_{DC}+I(t)$. RSSI circuit 126 can provide an output that is the DC component, $I_{DC}$. In an adaptive approach, the total tail current of amplifier stage 116 ($I_0+a*I_{DC}$), has a constant factor ($I_0$) plus a variable portion ($a*I_{DC}$) that is proportional to the input DC current ($I_{DC}$), that is input to current source 136 by RSSI 126. This adaptive approach avoids the large power consumption over the whole dynamic range.

The fact that the input current swing is proportional to the input DC current $I_{DC}$, the linear operating range of amplifier stage 116 can thus be adaptively adjusted in proportion to the input DC current $I_{DC}$. The DC current $I_{DC}$ can be provided by the RSSI circuit 126, which may already a part of most TIAs 104, or $I_{DC}$ can be measured from the current sink, such as current sink 102 illustrated in FIG. 1. In applications where the DC current and the AC current of the photodiode are not correlated, a peak-detector can be used to adaptively adjust the linear operating range.

Figure 3:
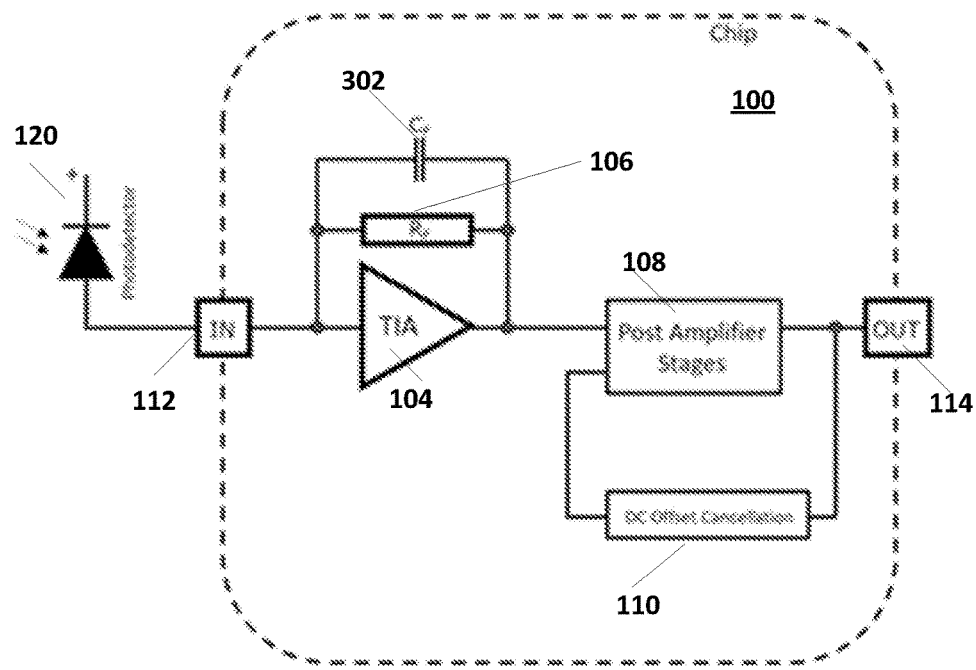
FIG. 3 illustrates another depiction of a conventional trans-impedance amplifier in a photodiode circuit.

FIG. 3 illustrates another example of a conventional system 100. In a transimpedance amplifier, the conversion rate from input current to output voltage is mainly defined by one resistor, feedback resistor 106. Frequency response may be harmed by parasitic capacitance of resistor 106. As is further illustrated in FIG. 3, a parallel capacitance 302 is useful to limit high frequency gain. Some embodiments of the present invention convert the undesired parasitic capacitance of the feedback resistance to perform the function of the desired parallel capacitance 302.

As discussed above, in the conventional transimpedance amplifier (TIA) 104, the major element is the transimpedance feedback resistor $R_F$ 106 and, often used, the parallel capacitance $C_F$ 302. As discussed above, capacitance $C_F$ 302 limits the bandwidth at high frequencies and can be used to avoid oscillations and overshoot.

Figure 4:
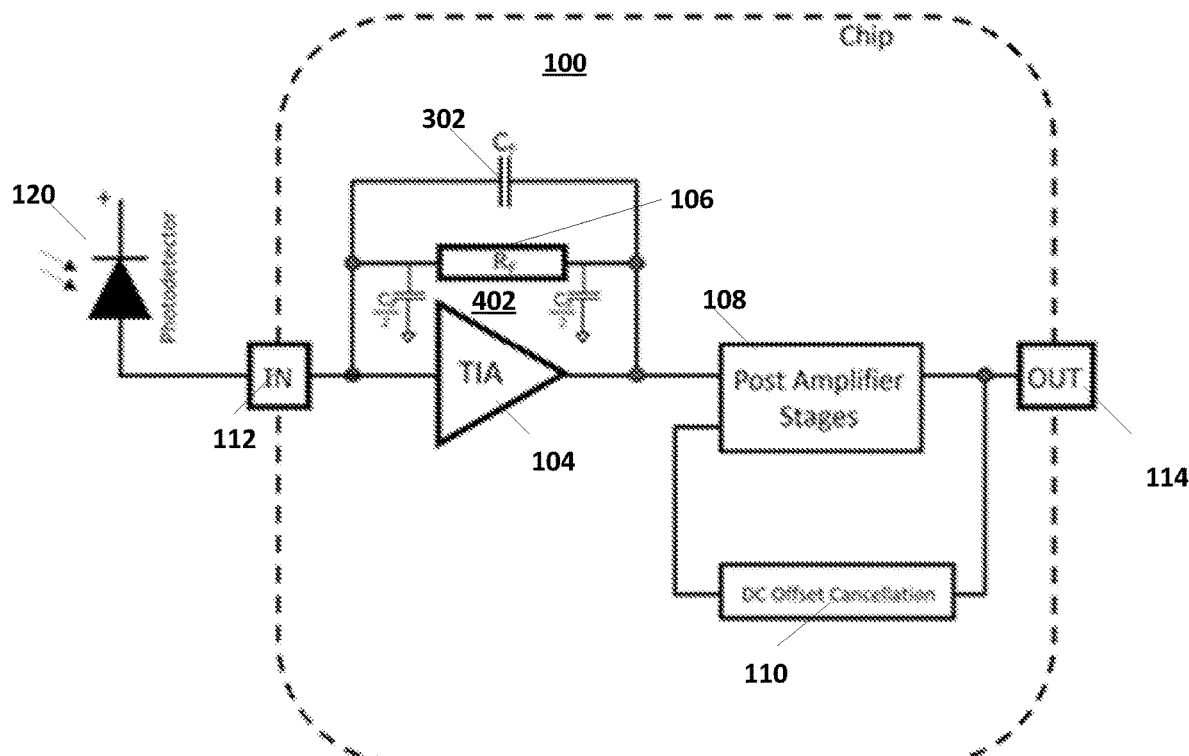
FIG. 4 illustrates the TIA feedback resistor parasitics.

As illustrated in FIG. 4, the feedback resistor 106 has parasitic capacitance (Cp) 402 that can be roughly modeled by a simple pi-model (two capacitors of value Cp/2 positioned on either side of an idealized resistor 106). This parasitic capacitance 402 is formed between the bottom side and the substrate (or nwell) of the chip on which resistor 106 is formed. In this specific circuit, one half of that capacitance is connected to the sensitive input (the input of TIA 104), while the second half to the insensitive output (the output of TIA 104). In addition to the resistor parasitic capacitances 402 illustrated in FIG. 4, the implementation of feedback capacitor $C_F$ 302 introduces additional wiring and capacitance to the input node of TIA 104.

Figure 5:
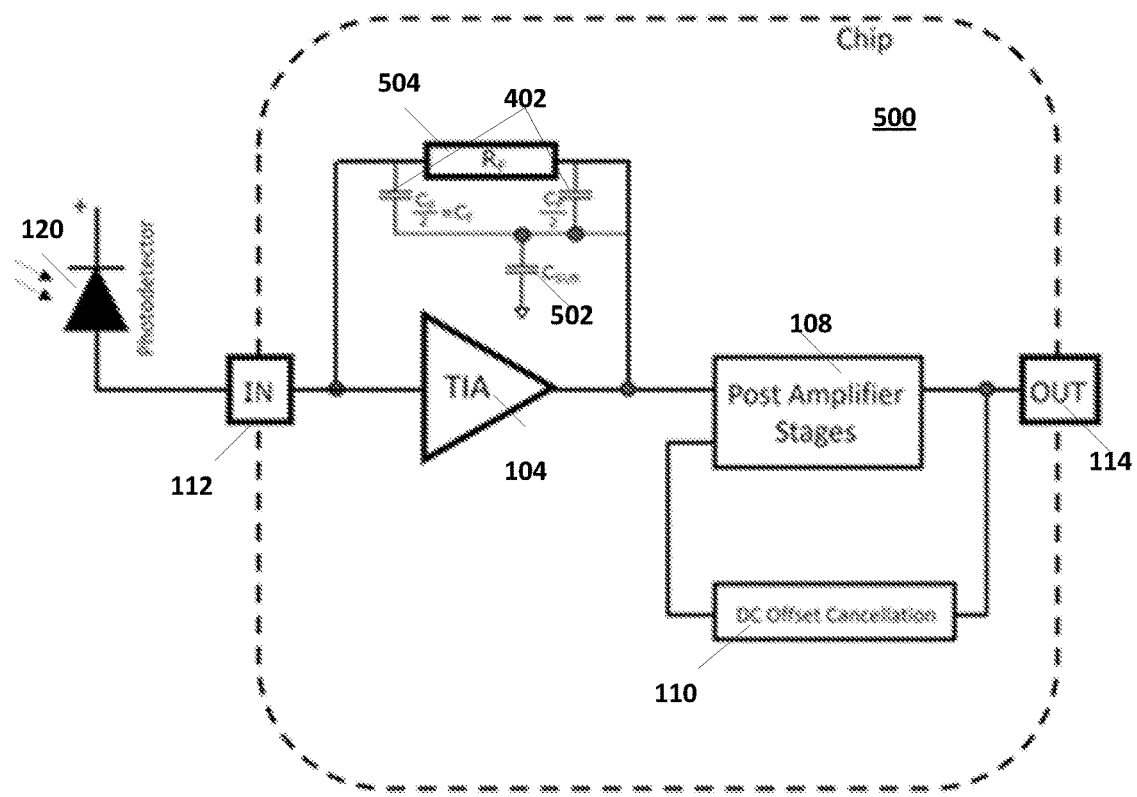
FIG. 5 illustrates a shielded feedback resistor and the changed equivalent circuit.

An embodiment 500 illustrated in FIG. 5 provides resistor 504 that includes a capacitive shield 502. In accordance with some embodiments, to avoid the undesired parasitic capacitance of $C_F$ 302 and the related routing, a metal shield 502 can be placed between the resistance and the substrate to form resistor 402. Typically, the resistance is part of the metal stack of the semiconductor.

As is illustrated in the equivalent circuit system 500 according to some embodiments illustrated in FIG. 5, the parasitic capacitances 402 and the shield capacitance 502 are all connected to create that desired parallel capacitance $C_F$. Consequently, capacitor 302 is eliminated, eliminating additional contribution to the sensitive input. The shield bottom plate to substrate capacitance $C_{SUB}$ 502 is connected to the insensitive output node. The level of the shielding metal layer is a design parameter such that half the parasitic capacitance of the resistor, capacitances 402, is equal to the desired $C_F$ 302 as shown in FIG. 5, $C_P/2=C_F$.

Embodiments as illustrated in FIG. 5 not only prevent additional parasitic capacitance on the highly sensitive node, the input node to TIA 104, it also eliminates the negative effect of the inevitable parasitic capacitance of resistor 504 by converting that capacitance to a useful parallel capacitance, eliminating the need for the additional capacitance.

As illustrated in FIG. 1, in a typical transimpedance amplifier (TIA) application, the TIA sinks the average photodiode current at the input node as shown by DC current sink 102. This current may vary in a very large range (e.g. 100 μA to 3 mA). This means that the TIA current sink is designed to support high current, while minimum device size is desired to avoid drawbacks to frequency response and noise.

Figure 6:
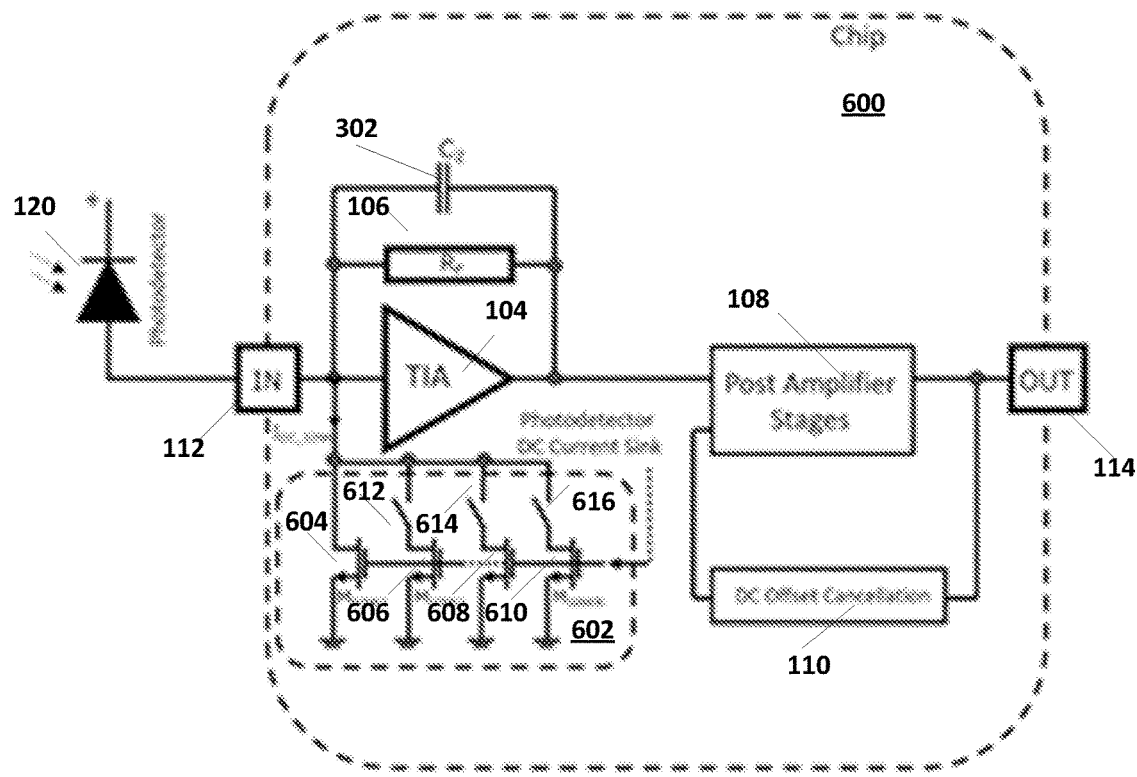
FIG. 6 illustrates an embodiment with a switchable current sink.

FIG. 6 illustrates an embodiment system 600 where current sink 602 is segmented to better cover the range of sink currents. As illustrated in FIG. 6, the photodetector (PD) 120 DC current is sinked through current sink 602 so that the AC input current can proceed into the RF chain (TIA 104 and post amplifiers 108) without jeopardizing the DC operating point at the input of TIA 104. There are various ways to build this feedback mechanism such as copying over the cathode current of PD 120 or zeroing the DC voltage across feedback resistor 106.

In system 100 as illustrated in FIG. 1, current sink 102 is formed with a sink transistor. Considering the proper operation over a wide dynamic range of input current, the DC current sink 102 needs to be sized to handle a large DC current level. This large device, however, contributes significantly (10-20%) to the overall input referred noise.

System 600 as illustrated in FIG. 6 provides for a current sink block 602 that allows for a decrease of the large contribution of this DC current sink block when there is sensitive low current generated by photodetector 120. As illustrated in FIG. 6, current sink block 602 includes parallel sinking branches (e.g., parallel switched transistors to ground) and gradually turning more branches on for higher input DC current. As illustrated in FIG. 6, a first transistor 604 is coupled between the input of TIA 104 to ground. One or more switched transistors are coupled in parallel with transistor 604. FIG. 6 illustrates transistor 606 in series with switch 612 covered across transistor 604, transistor 608 in series with switch 614 coupled across transistor 604, and transistor 610 in series with switch 616 coupled across transistor 604. Embodiments can include any number of switched transistors in parallel with transistor 604 such that the size of the transistor coupled between the input and ground can be adjusted as the input current from photodiode 120 increases. The input referred noise thus is greatly improved as some segments are turned off for the sensitive low current operation.

The above detailed description is provided to illustrate specific embodiments of the present invention and is not intended to be limiting. Numerous variations and modifications within the scope of the present invention are possible. The present invention is set forth in the following claims.

What is claimed is:

1. A photodiode circuit, comprising:
a transimpedance amplifier;
a resistor coupled across the transimpedance amplifier; and
an amplifier stage coupled to receive an output from the transimpedance amplifier,
wherein the photodiode circuit provides dynamic range across a current range of the photodiode circuit,
wherein the transimpedance amplifier includes a receive signal strength indicator that provides a DC current signal to a tail of a first amplifier stage, the tail providing a current that is adaptively related to the DC current, the first amplifier stage comprising:
a first transistor with base coupled to receive an output signal from the transimpedance amplifier, the emitter of the first transistor coupled through a first resistor to a current source; and
a second transistor with base coupled to a reference signal, the emitter of the second transistor coupled through a second resistor to the current source,
wherein the current source provides a current linearly related to the DC current signal from the receive signal strength indicator.

2. The photodiode circuit of claim 1, wherein the current source includes a first current source generating a current proportional to the DC current signal from the receive signal strength indicator and a second current source coupled in parallel with the first current signal that generates a constant current.

3. The photodiode circuit of claim 1, further including a current sink coupled to the input of the transimpedance amplifier, the current sink directing DC component of a current signal received from a photodiode to ground and allowing the AC current from the current signal to enter the transimpedance amplifier.

4. The photodiode circuit of claim 3, wherein the current sink includes a plurality of switchable parallel current sinks.

5. A photodiode circuit, comprising:
a transimpedance amplifier;
a shielded resistor coupled across the transimpedance amplifier; and
an amplifier stage coupled to receive an output from the transimpedance amplifier,
wherein the photodiode circuit provides dynamic range across a current range of the photodiode circuit, and
wherein the shielded resistor includes a metallic shield that provides a capacitance that combines with a parasitic capacitance to provide feedback capacitance across the transimpedance amplifier.

6. The photodiode circuit of claim 5, further including a current sink coupled to the input of the transimpedance amplifier, the current sink directing DC component of a current signal received from a photodiode to ground and allowing the AC current from the current signal to enter the transimpedance amplifier.

7. The photodiode circuit of claim 6, wherein the current sink includes a plurality of switchable parallel current sinks.

* * * * *